United States Patent
Heide et al.

(10) Patent No.: US 7,119,736 B2
(45) Date of Patent: Oct. 10, 2006

(54) TRANSPONDER SYSTEM AND METHOD FOR MEASUREMENT OF SEPARATION

(75) Inventors: Patric Heide, Vaterstetten (DE);
Martin Nalezinski, München (DE);
Martin Vossiek, Hildesheim (DE); Leif Wiebking, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/495,104

(22) PCT Filed: Nov. 5, 2002

(86) PCT No.: PCT/DE02/04098

§ 371 (c)(1),
(2), (4) Date: Sep. 14, 2004

(87) PCT Pub. No.: WO03/040753

PCT Pub. Date: May 15, 2003

(65) Prior Publication Data

US 2005/0012653 A1    Jan. 20, 2005

(30) Foreign Application Priority Data

Nov. 9, 2001    (DE) ................. 101 55 251

(51) Int. Cl.
*G01S 13/82* (2006.01)
*G01S 13/84* (2006.01)
*G01S 13/87* (2006.01)
*G01S 13/00* (2006.01)

(52) U.S. Cl. .................. 342/125; 342/42; 342/43; 342/118; 342/175

(58) Field of Classification Search ........... 342/29–51, 342/118, 125, 175, 187–197, 52–58, 60, 127–146
See application file for complete search history.

(56) References Cited

U.S. PATENT DOCUMENTS

| 2,786,996 | A | | 3/1957 | Todd | |
|---|---|---|---|---|---|
| 2,950,473 | A | * | 8/1960 | Familier et al. | 342/125 |
| 3,524,201 | A | * | 8/1970 | Land, Jr. | 342/51 |
| 3,659,292 | A | * | 4/1972 | Low et al. | 342/125 |
| 4,006,477 | A | * | 2/1977 | Yost et al. | 342/51 |

(Continued)

FOREIGN PATENT DOCUMENTS

DE        198 60 058        3/2000

(Continued)

OTHER PUBLICATIONS

M. Vossiek, R. Roskosch, and P. Heide, Precise 3-D Object Position Tracking using FMCW Radar, 29th European Microwave Conference, Munich, Germany, 1999, pp. 234-237.

(Continued)

*Primary Examiner*—Bernarr E. Gregory
(74) *Attorney, Agent, or Firm*—Young & Thompson

(57) ABSTRACT

Separation determination systems for determining the separation between a base station and a transponder, whereby the base station includes an oscillating signal source, for generating a signal and a transmission device for broadcasting the signal. The transponder includes a receiving device, for receiving the signal from the base station, an oscillator, for generating a signal which is phase-coherent therewith and a transmission device for broadcasting the phase-coherent signal. The base station furthermore includes a receiver device, for receiving the phase-coherent signal from the transponder and a separation determination device for determining the distance between base station and transponder. The system and components may be improved whereby the oscillator in the transponder is energized with the received signal in order to generate a quasi-phase-coherent signal.

12 Claims, 4 Drawing Sheets

U.S. PATENT DOCUMENTS 4,047,171 A * 9/1977 Fugit ............................ 342/51
4,163,233 A * 7/1979 Becker ........................ 342/125
4,218,680 A * 8/1980 Kennedy ..................... 342/51

FOREIGN PATENT DOCUMENTS

| DE | 199 46 161 | 4/2001 |
|---|---|---|
| DE | 199 57 536 | 6/2001 |
| DE | 199 57 549 | 6/2001 |
| DE | 199 57 557 | 6/2001 |
| DE | 100 32 822 | 1/2002 |
| WO | WO 01/67625 | 9/2001 |

OTHER PUBLICATIONS

P. Heide:, Business Opportunities and Technology Trends-Millimeterwave Modules for Sensor Products and Broadband Wireless Communications, Compound Semiconductors Magazine, vol. 6, No. 2, Mar. 2000, pp. 82-88.

K. Finkenzeller, RFID-Handbuch, 2 ed. Munchen, Wien: Carl Hanser Verlag 2000.

* cited by examiner

TRANSPONDER SYSTEM AND METHOD FOR MEASUREMENT OF SEPARATION

CROSS REFERENCE TO RELATED APPLICATION

This is the 35 USC 371 national stage of international application PCT/DE02/04098 filed on 5 Nov. 2002, which designated the United States of America.

FIELD OF THE INVENTION

The invention relates to a method and a system for the determination of distances, or a base station and a transponder for that purpose, as applicable.

BACKGROUND OF THE INVENTION

Transponder systems, together with methods and arrangements for the exchange of data and for the measurement of the distance from a base station to a modulated transponder, exist in diverse forms, and have long been known. General forms of embodiment and principles will be found, for example, in "K. Finkenzeller, RFID-Handbuch, 2 ed. Munich, Vienna: Carl Hanser Verlag, 2000". Common as transponders are, for example, so-called back-scatter transponders, which do not have their own signal source but simply reflect back the signal they receive, sometimes in amplified form.

In the text which follows such systems, which can be used to measure the distance between the base station and the transponder, are generally described as radio frequency localization systems or RFLO systems (Radio Frequency LOcalisation), by analogy with RFID (Radio Frequency IDentification). Advantageous embodiments of RFLO arrangements of this type, which are based on the principle of the FMCW radar (Frequency Modulated Continuous Wave) or related principles, are described in detail in, for example, "M. Vossiek, R. Roskosch, and P. Heide, Precise 3-D Object Position Tracking using FMCW Radar, $29^{th}$ European Microwave Conference, Munich, Germany, 1999" and in DE 199 46 161, DE 199 57 536 and DE 199 57 557. DE 199 46 161 indicates methods for the measurement of the separating distance from a transponder, with the classical forms of FMCW backscatter transponders and systems being described here. DE 199 57 536 and DE 199 57 549 describe vehicle access systems, in particular anti-theft systems, embodiments and application, some of which also use FMCW backscatter transponders.

A disadvantage of RFLO backscatter systems of this type is that the signal which is transmitted must propagate across the path from the base station to the transponder and back and accordingly, as determined by the radar equation, the signal-to-noise ratio (SNR) for the entire transmission path falls off in proportion to the $4^{th}$ power of the distance. The free field attenuation, which increases sharply with the frequency, makes it almost impossible to realize very high frequency passive backscatter transponders in the GHz range, in particular, with a satisfactory signal-to-noise ratio. One particular reason why this is unsatisfactory is because it would in principle be very advantageous to use GHz systems, because of the high available bandwidth, both for distance measurement and also for fast data transmission.

If a separate source is used in the transponder to generate a new signal, based on and phase-coherent with the received signal, then each signal must traverse the base station/transponder path only once. In this case, the signal-to-noise ratio is only inversely proportional to the square of the distance. An additional factor is that the miscellaneous attenuations and losses on the transmission path affect the signal which is transmitted back only once, and not twice. As a result, particularly where the distances are large, the signal-to-noise ratio is larger by orders of magnitude than for simple backscatter systems. However, systems of this type are very much more expensive than the passive backscatter arrangements cited, for example in terms of circuit components, current consumption, manufacturing and maintenance costs, and consequently cannot be considered for many applications.

A further fundamental problem, of RFLO backscatter systems consists, as will be seen from DE 199 46 161 and "M. Vossiek, R. Roskosch, and P. Heide, Precise 3-D Object Position Tracking using FMCW Radar, $29^{th}$ European Microwave Conference, Munich, Germany, 1999", in the fact that they are frequently not in a position to measure reliably very short distances between the transponder and the base station. However, it is precisely such short distances which are of particular interest, for example, for access systems and local positioning systems (LPS). The problem is that that it is not possible, mainly for legal but also for technical reasons, to use arbitrarily large modulation bandwidths, B.

As described in the literature sources cited there are, for example with FMCW backscatter RFLO, two spectral components, the distance between which in terms of frequency or phase is proportional to the distance "dist" between the transponder and the base station. The effect of the limited modulation bandwidth is now that the spectral components are not arbitrarily narrow but, when subjected to the usual analysis by a Fourier transformation, have a width of at least $\Delta p = c/(2*B)$ for physical reasons, where c is the speed of light, B the modulation bandwidth and Ap is the distance here converted to meters.

The physically meaningful frequency of a spectral component corresponds to its maximum value, which normally lies in its center. When the distance is less than a certain minimum, the spectral components overlap. The result of this is that the maximum of the spectral components no longer corresponds to the physically meaningful frequency, and hence there is no magnitude which can be simply read off to determine the frequency, so that the distance can no longer be determined exactly. It is also possible that the two spectral lines extend so far into each other that they are no longer recognizable as separate lines. If the measurement is made with a bandwidth such as 80 MHz, for example, which is the maximum available at 2.45 GHz in the common ISM radar band (ISM=Industrial-Scientific-Medical), which is available worldwide and standardized, then with simple arrangements it is normally no longer possible to detect exact measurement values below a minimum spacing of about 2 m. In practice, indeed, it is normally not possible below 4 m, because in order to calculate the Fourier transformation the time signal is normally weighted by a window function, which has the effect of further degrading the resolution.

According to "M. Vossiek, R. Roskosch, and P. Heide, Precise 3-D Object Position Tracking using FMCW Radar, $29^{th}$ European Microwave Conference, Munich, Germany, 1999", this problem can be solved by the use of a delay line, which enforces a fixed basic propagation time for the signal. However, apart from the extra circuitry costs, every dead time in the transponder causes substantial problems in respect of drift and the measurement inaccuracies which result from this.

SUMMARY OF THE INVENTION

It is the object of the invention to indicate a particularly simple method, with which it is possible to determine in an alternative way the distance to a transponder, right down to the short-range.

This object is achieved by the method for distance measurement with the characteristics of patent claim 1, the distance determination system with the characteristics of patent claim 2, or base stations and transponders for that purpose, as applicable. Advantageous forms of embodiment are the subject of the subclaims.

The transponder system and the method for distance measurement make it possible to determine the distance to a transponder very exactly, right down to the short-range. In addition, it makes possible a design solution which permits a particularly design- and cost-effective implementation of the arrangement. Further, it makes possible analysis methods which permit a particularly advantageous evaluation of the measurement signals, and hence a high reliability and accuracy in the measurement.

If the distance determination equipment in the base station includes a mixer, for mixing the quasi-phase-coherent signal received from the transponder and the instantaneous transmission signal to form a mixed signal, the result is a measurement signal which has at least 2 spectral components, the frequency spacing or phase spacing of which is a measure of the distance from the base station to the transponder, where this measure is independent of the frequency at which the oscillator in the transponder is switched on and off.

Modulating or tuning out the modulation of frequency of the base station's transmission signal results ultimately in a measurement signal which contains spectral components which are expressed as cosine functions, and which are amplitude-weighted. It is advantageous that, by using a frequency shift dedicated to the transponder described, it is also possible to make measurements of small distances, down to a value of zero. It is also possible to perform a Fourier transformation of the amplitude-weighted measurement signal in the frequency domain, which produces spectral lines (sidebands) with a squarewave-shaped envelope, where the outer edges of a left and a right sideband lying nearest to the modulation frequency determine the distance between the base station and the transponder.

By developing the transponder or base station, as applicable, as an LTCC module (Low Temperature Cofired Ceramic) or by using at least one LTCC module (LM) it is possible to achieve compact and low-cost construction.

Because the modulation frequency, for the on-and-off switching of the oscillator in the transponder, does not enter into the evaluation of the distance, carried out in the base station, it can be used to transmit additional information from the transponder to the base station.

By assigning a modulation frequency, at which the oscillator in the transponder is switched on and off, individually to each of a large number of transponders, it is possible to address selectively the various transponders within the transmission area of a base station.

BRIEF DESCRIPTION OF THE DRAWINGS

An exemplary embodiment is explained below in more detail, by reference to the drawings. These show.

DETAILED DESCRIPTION OF THE INVENTION

Figure 1:
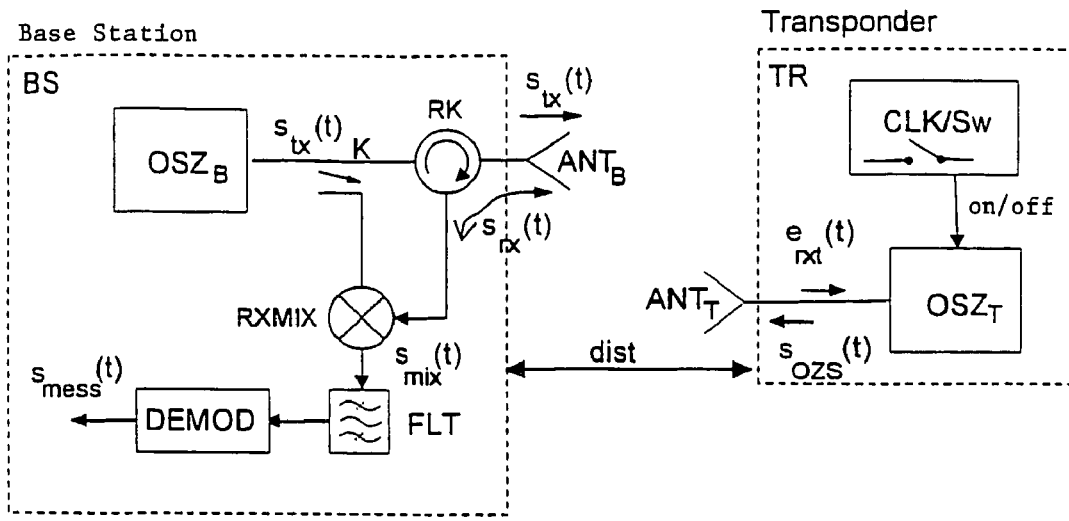
FIG. 1 an example of the arrangement of a base station and a transponder, which communicate with each other.

As can be seen from FIG. 1, a typical arrangement has a base station BS and a transponder TR, which communicate with each other, and numerous other individual components.

The base station BS incorporates, in particular, an oscillator $OSZ_B$ for generating an oscillating signal $s_{tx}(t)$, which is output or can be tapped off at an oscillator output. The oscillator output is connected to a transmitting antenna, which may optionally also be used as the receiving antenna $ANT_B$, as shown here, so that the signal $s_{tx}(t)$ can be radiated out via the antenna $ANT_B$.

In the present case, there is in the base station BS a directional coupler RK in the circuit between the oscillator output and the antenna $ANT_B$. This has another output, which feeds to a mixer RXMIX and other components.

The transponder TR has an antenna $ANT_T$, with which the signal from the base station BS, generated by means of the oscillator $OSZ_B$ and radiated out via the antenna $ANT_B$, can be received as an external signal $e_{rxt}(t)$. In the present example, the antenna also serves advantageously as the transmitting antenna $ANT_T$.

In addition, the transponder TR has an oscillator $OSZ_T$ connected to the antenna $ANT_T$. A clock controller CKL/Sw is also provided, to excite the oscillator $OSZ_T$. The oscillator $OSZ_T$ is switched on and off cyclically by the clock controller CLK/Sw at a frequency of $f_{mk}$. The signal $S_{OSZ}(t)$ generated by the oscillator $OSZ_T$ is then quasi-coherent with the reference signal $sig_{IN}$. The switching on and off of the oscillator $OSZ_T$ also switches its quasi-phase-coherent excitability.

It is advantageous if the oscillator 2 is so constructed that, on the one hand, it is not excited into oscillation by thermal noise, but on the other hand that a received or base signal $e_{rxt}(t)$, as applicable, which is injected into it is sufficient to excite oscillations which are quasi-phase-coherent with the base signal $e_{rxt}(t)$. In this case, quasi-phase-coherent also means, in particular, that the phase difference between the base signal and the generated reference signal is small, where the term small is to be interpreted in the context of the intended communication or measurement function respectively. The limit often used for a small phase difference is, for example, a value of $\pi/10$, that is about 20°. Such signals, with only small phase differences, are referred to below as quasi-phase-coherent, and the time span over which this coherence is maintained as the coherence time.

It is expedient in this connection if not only are the oscillations of the active oscillator quasi-phase-coherent with the base signal, but that the excitation itself of the active oscillator is effected quasi-phase-coherently. Whereas, with devices and methods in accordance with the state of the art, the active oscillator is excited by thermal noise, and its oscillations can only later be made phase-coherent by an expensive regulation process and a lock-in, here it is advantageous that the oscillator is excited or starts to oscillate, as applicable, quasi-phase-coherently even as a result of the base signal, so that the phase coherence is, as it were, automatically established.

Thus, in the transponder TR a greater or smaller part of the received or base signal $e_{rxt}(t)$, as applicable, is injected into the oscillator $OSZ_T$. Preferably, the base signal and the corresponding oscillator signal will be electrical. In principle, however, it would be possible to realize an arrangement which uses optical, acoustic or other signals. The received or base signal $e_{rxt}(t)$ excites oscillations in the oscillator $OSZ_T$ quasi-phases-coherently, causing the latter to generate an oscillator signal which is extracted from the oscillator as the signal $S_{OSZ}(t)$ and tapped off via an output. The input for the received or base signal $e_{rxt}(t)$ and the output for the oscillator signal B can be wholly or partly identical. However, they may also be realized separately from each other.

Using the antenna $ANT_T$ of the transponder TR, the signal $S_{OSZ}(t)$ which is generated in the transponder TR is transmitted back to the base station BS, and is received by the latter with the antenna $ANT_B$.

Through the directional coupler RK, the signal received in this way in the base station BS is separated from any signal which is being transmitted at the same instant, and is mixed in the mixer RXMIX with part of the signal which the base station's oscillator $OSZ_B$ is generating at that instant.

A filter FLT downstream from the mixer RXMIX suppresses the mixture components which are of no interest. This filter FLT in the base station BS will preferably take the form of a bandpass filter, for which the central frequency should be matched to the clock rate of the clock controller CLK/Sw of the transponder TR.

As a result, the exemplary base station is designed like a common FMCW radar device, with the illustrated topology representing only one example, but in principle any desired choice of the common radar designs using frequency modulation could be used. It is advantageous that only the components downstream from the received signal mixer RXMIX and the signal analysis need to be adapted to correspond to the modulation in the transponder TR.

The function of the advantageous method for distance measurement can be derived as follows:

We assume first that the transmit signal $s_{tx}(t)$ from the base station is a single-frequency signal with the form $$s_{tx}(t) = \sin(\omega_c + \omega_{sw}) \cdot t + \phi_0$$

where $\omega_c$ represents the central frequency, $\omega_{SW}$ an initially fixed modulation frequency, t the time and $\phi_0$ any arbitrary phase offset.

This signal is sent from the base station to the transponder, and arrives at the transponder TR, delayed by the propagation time $\tau/2$ where $\tau/2 = dist/c$, dist being the distance between the base station BS and the transponder TR and c being the speed of light, as the transponder received signal $e_{rxt}(t) = s_{tx}(t - \tau/2)$. As described above, the oscillator $OSZ_T$ of the transponder TR is switched on and off cyclically. The duration of the period over which the oscillator $OSZ_T$ is switched on or off respectively is represented below as Ts, where $Ts = 1/(2f_{mk})$.

With the preferred arrangement, each time a switch-on process is executed the oscillator $OSZ_T$ starts to oscillate at its oscillation frequency $\omega_{OSZ}$ exactly at the current phase position of $e_{rxt}(t)$. For example, if the oscillator is switched on at the time point $t = -\tau/2$, then its phase when it starts to oscillate is $$\phi_i = \arg\{s_{rxt}(-\frac{\tau}{2})\} = \arg\{s_{tx}(-\tau)\} = (\omega_c + \omega_{sw}) \cdot (-\tau) + \phi_o$$

and consequently the oscillator signal $s_{OSZ}(t)$ is given by:

$$s_{osz}(t) = \sin(\omega_{osz} \cdot (t + \frac{\tau}{2}) - (\omega_c + \omega_{sw}) \cdot \tau + \phi_o).$$

The oscillator signal $s_{OSZ}(t)$ then arrives at the base station BS, delayed in turn by the propagation time $\tau/2$, as the received signal $s_{rx}(t)$ where $$s_{rx}(t) = s_{osz}(t - \frac{\tau}{2}) = \sin(\omega_{osz} \cdot t - (\omega_c + \omega_{sw}) \cdot \tau + \phi_o)$$

and there it mixed with the current transmit signal $s_{tx}(t)$. Neglecting the high-frequency mixture products, and making the simplifying assumption that $\omega_{OSZ} = \omega_c$, which for a suitable choice of $\omega_{SW}$ can be done with no loss of generality, then the mixture signal $s_{mix}(t)$ is given by $$s_{mix}(t) = \cos(t \cdot \omega_{sw} + \tau \cdot (w_c + \omega_{sw})).$$

Figure 2:
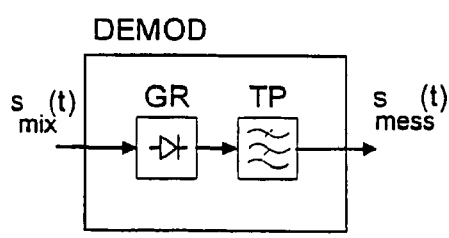
FIGS. 2 and 3 examples of demodulators for such a base station.

In what follows, the assumption is now made that downstream from the receive mixer RXMIX there are electronic components/facilities, DEMOD, which have the effect that the change over time of the voltage, during the time interval between switching on and switching off, that is from 0 . . . Ts, is to be eliminated in the sense of averaging. A simple state-of-the-art envelope curve demodulator, by which the signal is rectified and then low-pass filtered, would for example work in this sense. One embodiment of such a simple demodulator DEMOD with a rectifier GR and the low-pass filter TP is shown in FIG. 2.

Figure 3:
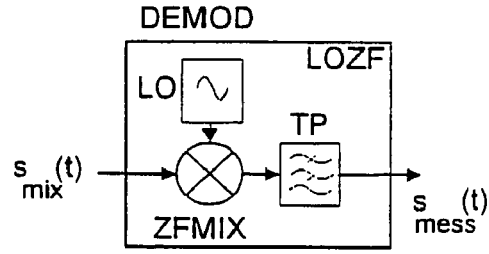

A more advantageous variant of a demodulator DEMOD, outlined in FIG. 3, consists in mixing down the mixture signal, preferably with a frequency close to or the same as the cyclic frequency $f_{mk}$ of the clock controller CLK/Sw, to a lower frequency and then filtering it with a filter TP which at least exhibits low-pass characteristics. One possible embodiment of this variant has a local oscillator LOZF, a mixer ZFMIX and a low pass TP. If the frequency of the local oscillator is so arranged that negative mixture frequencies can arise, then as is generally known, the mixer ZFMIX must be arranged as an IQ mixer (IQ: In-phase and Quadrature-phase, i.e. 90° phase displacement) which supplies real and imaginary parts. In place of the low-pass filter TP, it is also possible to use, for example, a bandpass filter.

Considering the time interval 0 to TS, the facilities described have the effect of determining a type of effective value of the voltage from the mixture signal $s_{mix}(t)$. This effective value then subsequently forms the actual measurement signal $s_{mess}(t)$. In the following description, constant amplitude factors are ignored, with no loss of general validity. The effective value of $s_{mix}(t)$ in the time interval 0 to TS, i.e. $s_{mess}(t)$, is calculated as follows:

$$s_{mess}(t) = \int_o^{T_s} s_{mix}(t)$$

$$= const. \cdot \frac{\cos\left(\omega_c \cdot \tau + \omega_{sw} \cdot \tau + \frac{1}{2} \cdot T_s \cdot \omega_{sw}\right) \cdot \sin\left(\frac{1}{2}T_s \cdot \omega_{sw}\right)}{\omega_{sw}}.$$

As the operation of the measurement system will preferably be frequency modulated, we consider below the case in which the modulation frequency $\omega_{SW}$ is modulated as a function of time. If $\omega_{SW}$ is varied linearly over a time interval of T across the bandwidth B, from –B/2 to +B/2, the following applies $$\omega_{sw} = \frac{2 \cdot \pi \cdot B \cdot t}{T},$$

the FMCW measurement signal $S_{messfmcw}(t)$ which results from $s_{mess}(t)$ is thus:

$$S_{messfmcw}(t) = \cos\left(\omega_c \cdot \tau + \frac{[2 \cdot \pi \cdot B \cdot t \cdot \tau}{T} + \frac{\pi \cdot B \cdot t \cdot T_s}{T}\right) \cdot \frac{\sin\left(\frac{\pi \cdot B \cdot t \cdot T_s}{]T}\right)}{\left(\frac{\pi \cdot B \cdot t}{T}\right)}.$$

As previously described, in the derivation using the signal $S_{messfmcw}(t)$ it is only the signal over one switch-on period which is represented exactly. As a result of the fact that this signal is, in addition, modulated by a periodic modulation in the transponder, a frequency shift arises in $S_{messfmcw}(t)$, or additional spectral components, as applicable. As this effect of modulation is well known, and is described in the cited state of the art, in what follows we consider by way of example only one individual spectral component, or the signal $s_{messfmcw}(t)$, as appropriate, initially as though it had not been cyclically modulated.

This measurement signal $S_{messfmcw}(t)$ now exhibits two critical and very advantageous differences from the signals from standard FMCW transponder systems.

On the one hand, the measuring frequency $f_{mess}$, which is given by the derivative of the phase of the argument of the cosine function, that is $$f_{mess} = dist \cdot \frac{2 \cdot B}{T \cdot c} + \frac{B \cdot T}{2 \cdot T} = f_{beat} + \Delta b,$$

is displaced by the frequency component $\Delta b = B*T_s/(2\ T)$. The frequency $f_{beat}$ corresponds to the normal FMCW measuring frequency, and contains the actual measurement data, namely the distance between the base station BS and the transponder TR with $\tau=2\ dist/c$. On the other hand, the signal $s_{messfmcw}(t)$ is amplitude-weighted by a trigonometric function, specifically an Si function (Si(x)=sine(x)/x). If one uses the Fourier transformation to transform this amplitude-weighted signal into the frequency domain, then the outstanding measuring characteristics of this signal become clear. The Fourier transform of the present Si function produces a squarewave function, where the width $\Delta p$ of the rectangle is $$\Delta p = \frac{B \cdot T_s}{T}$$

The fact that the central frequency $f_{mess}$ of the squarewave lies at $f_{beat}+\Delta b=f_{beat}+0.5\Delta p$, due to the frequency shift as explained, ensures that the right and left sidebands of the cosine function do not run into each other even when the distance is 0. That is to say, with the appropriate transponder system it is possible to measure down to a distance of 0 without problem, in principle independently of the bandwidth. It follows that this system does not have the short-range problem of comparable known methods.

Figure 4:
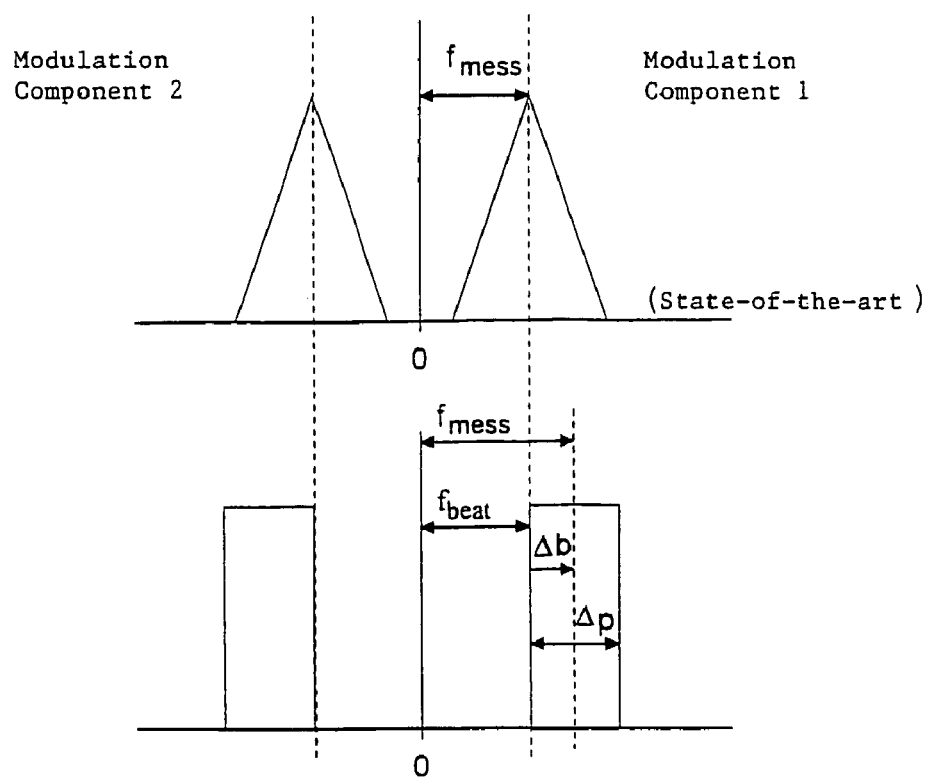
FIG. 4 modulation components after processing in accordance with the state-of-the-art or the present method, respectively.

This advantageous characteristic is supported by the fact that the envelope of the spectrum is, as has been shown, a squarewave function. Consequently, the beat frequency $f_{beat}$, and with it the distance between the base station BS and the transponder TS, can be determined by reference to the distance between the outer edges of the left and right sideband. The comparison, described above, of the signals from a conventional FMCW backscatter system and the present system, and the principle of their evaluation, is illustrated in FIG. 4.

Figure 10:
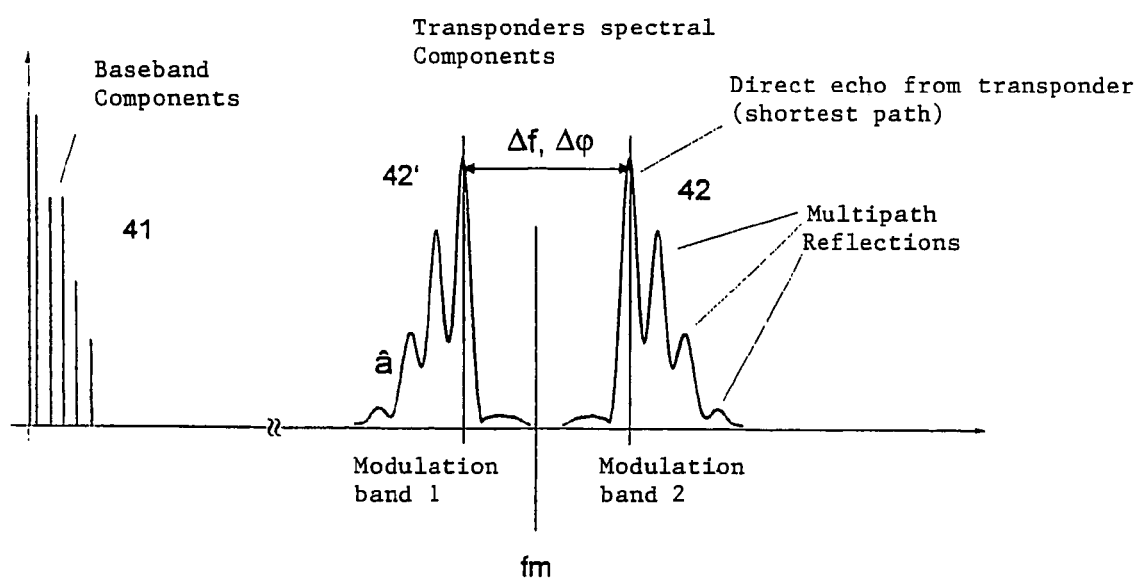
FIG. 10 an typical frequency spectrum for echo signals, as they are received as echo signals.

FIG. 10 is for general clarification, and shows the frequency spectrum of the echo signals which are received as the measuring signals (echo signals) by the base station BS of an FMCW backscatter system. The envelope of all the amplitudes a of the echo signals across the entire frequency range, or even over a mere section of it, is referred to as the echo profile, which must be evaluated. That is, the amplitudes â, phases φ and frequencies f of the echo signals are measured and subject to further processing in a computer unit.

The base station BS can work in accordance with the principle of the FM-CW method, known per se from radar technology. With this, the transmit frequency is varied within a prescribed frequency range (bandwidth). From a measurement of the frequency difference Δf or the phase difference Δφ between the transmit frequency and the receive frequency, it is possible to determine how far away an object is. That is, the received frequency f or phase φ are proportional to the distance.

As a result of the frequency translation due to the modulation by the transponder, there are echo signals in the upper frequency range, corresponding to the two sidebands 42 and 42' in the case of double-sideband modulation, to which reference is made as the echo profile or the distribution of the echo signals respectively against the frequency f and/or time t for the purpose of analyzing the echo signals and for distance measurement. As a result of the modulation, there are at least two sidebands 42 and 42', which are symmetrical about the modulation frequency $f_M$ of the transponder. In the case of on/off modulation, further spectral lines also arise for higher modulation components, which could be analyzed in the same way but which have a lower amplitude, and are therefore rather unfavorable for an evaluation and are usually simply filtered out, and are not considered here in order to simplify the description. Because some of the echo signals radiated out from the transponder may also be repeatedly reflected from objects, several maximum values will be obtained for the frequency f, where in each case the position of the associated frequency reflects the effective length of the transmission path. The echo profile of one sideband, 42 or 42', is sufficient to undertake an analysis in an evaluation unit, such as a microprocessor 27.

Figure 8:
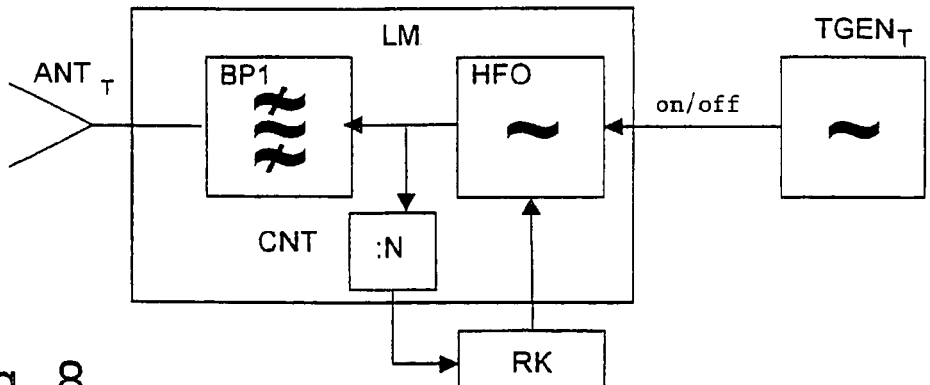
FIG. 8 a transponder with LTCC HF modules.

The first maximum, for example in FIG. 8 the maximum of the upper sideband 42 from FIG. 10 which lies closest to the modulation frequency $f_m$, is a direct echo signal from the transponder, i.e. has arisen from a direct free-space transmission with no reflection. The additional maxima represent longer transmission paths, arising due to reflection from objects.

In the frequency range about the mixture frequency of 0 Hz, which is also referred to as baseband 41, are the echo signals reflected directly from objects, such as would also occur with a conventional FMCW radar. These echo signals in baseband 41 are of less interest here.

The way that the present form of embodiment differs from the state of the art now consists in the facts that
a) the two sidebands are here displaced by the frequency component Δb, i.e. sideband 42' to the left by the frequency component Δb, and sideband 42 to the right by the frequency component Δb, so that the two sidebands do not run into each other even for a distance of 0, and
b) each of the envelopes of the spectral lines forms a squarewave function with a width of Δp and it is advantageous to make use of the inner edges, that is the two squarewave edges which lie closest to the modulation frequency fm on its right and left sides, for evaluation purposes.

Particularly advantageously, the transponder can be used with local positioning systems (LPSs). In the case of local positioning systems, the distance is measured from a transponder TR to at least two base stations BS which have known positions. By triangulation, the position of the transponder TR can then be determined in a plane or, if more base stations BS are used, even in three-dimensional space, in this case using a spherical cross-section method. In the case of local positioning systems the possibility described, of making use of the outer edges of the squarewave function for determining the beat frequency $F_{beat}$ or the separation distance dist, as applicable, is in particular also very advantageous because, for local positioning systems, it is always the shortest measured distances between the base station BS and the transponder TR which is of interest. The common measurement accuracy problems with state-of-the-art systems, which result from multi-path propagation, do not arise with the present system because of the principles involved if, as proposed, the evaluation is based on the inner edges of the squarewave function. The problems cited above due to the overlaying of spectral components in the case of the usual systems, and the advantage of the system described here, are clearly shown in FIG. 5.

Figure 5:
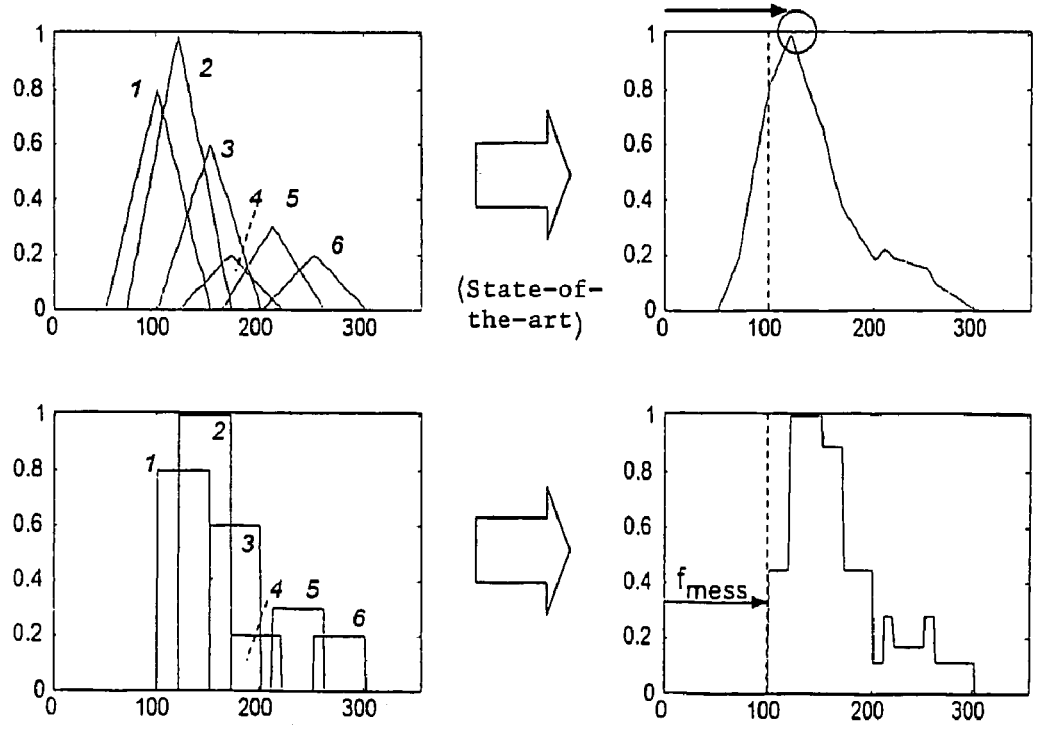
FIG. 5 the corresponding frequency/phase diagrams.

With the overlaying of, for example, 6 signal components (1, 2, . . . 6) as shown in FIG. 5, it can be seen that in the normal case the particular measured value $f_{mess}$, that is the maximum of the spectrum, does not correspond to the actual frequency which is proportional to the separating distance, here for example 100 Hz. By contrast, with the system described here the left-hand edge lies in the correct position even when there is overlaying of the signal components, i.e. a correct value will be determined for the spacing distance.

In a similar way to the assumption per se presented in "M. Vossiek, R. Roskosch, and P. Heide, Precise 3-D Object Position Tracking using FMCW Radar, 29$^{th}$ European Microwave Conference, Munich, Germany, 1999", where the starting point is peak values, it is advantageous to evaluate the distance between the two sidebands because then the modulation frequency of the transponder TR, which a priori is unknown, does not enter into the evaluation. If the measuring signal is, as already been explained above, demodulated using a classical envelope demodulator, or by other means is mixed to a frequency of exactly 0, or to another known frequency with which is known as exactly as possible, then of course the frequency spacing to a sideband, as is assumed per se with normal FMCW systems, suffices for a determination of the distance.

As always with FMCW radar, with the present system too it should be noted that the frequency modulation must preferably be highly linear, to prevent interference. Basically, the evaluation methods which are common with FMCW systems, in particular those having interference suppression, can be transferred across to the present system.

Further advantageous arrangements and methods for the evaluation of the signal $s_{rx}(t)$ received in the base station BS, which relate especially to the present method, are presented below.

In order to determine the distance values as exactly as possible, the following preferred evaluation variant is suggested. First, the measuring signal $s_{rx}(t)$ is weighted with a window function. Since an amplitude weighting already exists in principle, due to the Si envelope, a window function with a weak weighting, and hence with low side lobe attenuation, is sufficient. Suitable window functions are known per se. The sole effect of the window function should be to minimize the 'Gibbsian phenomenon', that is to produce a spectral squarewave function with a smooth graph, free of oscillations. For the calculation of the spectrum, the fast Fourier transform should preferably be used, because its characteristics have the direct result of transforming the Si function to the advantageous spectral squarewave function. Preferably, the magnitude of the spectrum will be evaluated. An evaluation of the phase, as available per se from the state of the art, is however also possible.

In order to determine the edges, in particular the first innermost edge, as exactly as possible, it is advantageous to differentiate the spectrum amplitude, because the steep edges of the squarewave then give marked peaks. The locations of the maxima of the peaks then correspond to the positions of the edges, or the points of inflection of the edge function, as applicable. This form of evaluation gives a simple means of avoiding the amplitude of the signal having any effect on the location determined for the position or, ultimately, on the distance which is determined, as would be the case with simple threshold value evaluations.

As the measuring signals and spectra are mostly only available in time-discretized form, it is also advantageous to further improve the determination of the locations of the maxima of the differentiated spectrum by using an interpolation calculation. A beneficial interpolation calculation can be performed, for example, using a common polynomial fit. For this purpose, it is preferable to use a number of the discrete spectral points in the immediate neighborhood of the maximum, for example 3, i.e. the maximum and its right and left neighbors, and a polynomial of even order, e.g. $2^{nd}$ order, i.e. a parabola. Other interpolation methods are equally usable, for example spline methods or methods such as those which fit the expected shape of curve to the measured curve by means of "least squares" methods.

All the methods cited can of course bring the advantages stated even when used individually, or in other combinations, and can also be combined with other methods familiar from FMCW radar systems or transponders.

As has already been explained, the distance measurement in the case when the two spectral sidebands are evaluated is independent of the modulation frequency $f_{mk}$ in the transponder. Hence, the modulation frequency can be used to transmit data from the transponder TR to the base station BS in parallel with, or in place of, the distance measurement. Position coding by frequency, which is known per se, is particularly suitable in this connection. For this purpose, the transponder TR must be provided with devices which permit the modulation frequency $f_{mk}$ to be swapped between at least two frequencies.

Figure 6:
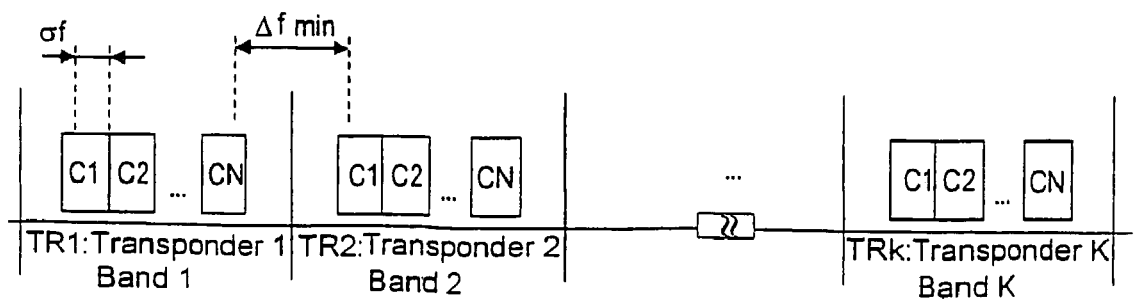
FIG. 6 the parameters which can be used for an exemplary arrangement.

Again, it may be advantageous to give the different transponders TR in a group different modulation frequencies $f_{mk}$, so that they can be unambiguously distinguished in a base station BS, even when they are interrogated at the same time. A convenient schema for the allocation of frequencies for a group which has a number K of transponders and using an N-value code is shown in FIG. 6. The minimum spacing Δfmin between the modulation frequencies for any two transponders TR should be chosen such that, regardless of the code and the distances between the transponder TR and base station BS, there is no overlap of the spectra for the transponder signals. The modulation step width of will preferably be chosen to be rather larger than the maximum expected uncertainty in the frequency measurement. This relationship and exemplary forms of embodiment of a corresponding position coding method are known per se, for example, from DE 198 60 058, which deals with a surface wave element with optimal code length which can be interrogated by radio.

Figure 7:
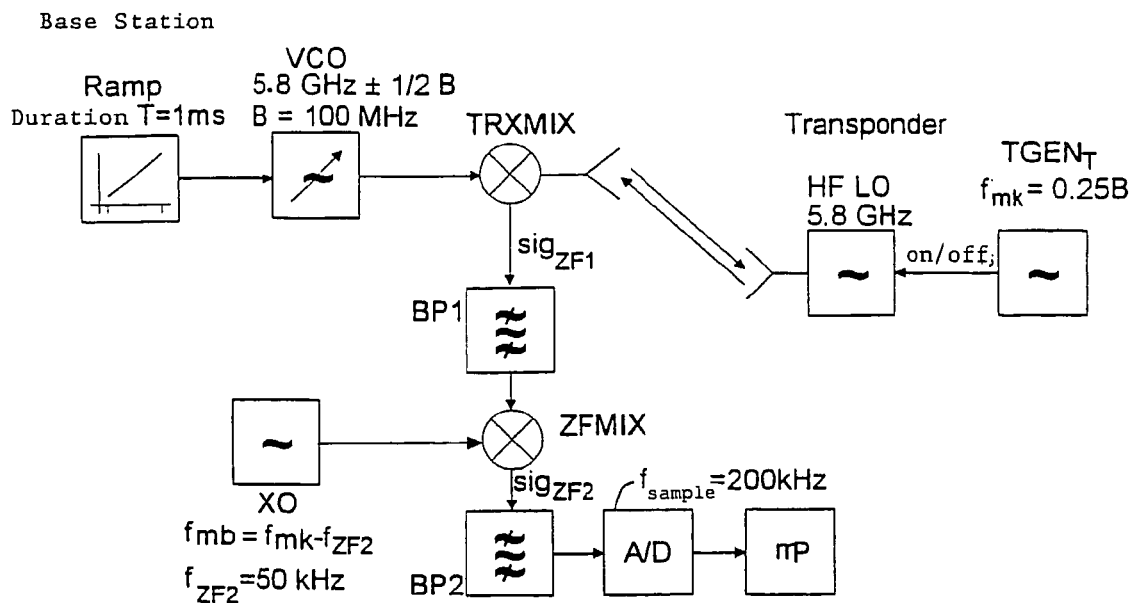
FIG. 7 a circuit arrangement with examples of the parameter values.

A convenient form of embodiment of the transponder and the base station, with advantageous choice of system parameters, is shown in FIG. 7. Here, the transmit/receive separation in the base station BS is effected using a transmission mixer TRXMIX. The modulation frequency $f_{mk}$ in the transponder TR, here for example 25 MHz, will advantageously be about ¼ of the modulation bandwidth B, in this case for example 100 MHz, of a voltage controlled oscillator VCO in the base station BS. The bandpass filter BP1, which should be centered on the modulation frequency $f_{mk}$, is used first to eliminate interfering signal components from the transponder signal. The mixture frequency $f_{mb}$ of the intermediate frequency mixer ZFMIX is preferably so chosen that the mixture does not produce a frequency of 0 but to some other lower intermediate frequency $f_{ZF2}$. This intermediate frequency range is then selected using the bandpass filter BP2, which should be centered around $f_{ZF2}$. The intermediate frequency $f_{ZF2}$, here 50 kHz, should be so chosen that all the signal components of interest, that is both sidebands, lie in a frequency range >0 for a certain chosen range of distances, so that the recording and evaluation of complex data values is unnecessary. Preferably, the measurement data will be digitized using an analog/digital converter, and processed in a microprocessor. The sampling frequency of the analog/digital converter, here for example 200 kHz, will preferably be chosen to be about four times as great as the intermediate frequency $f_{ZF2}$. The function of the bandpass filter BP2 will preferably be supplemented, or indeed replaced, by another digital bandpass filter in the microprocessor.

If data is also to be transmitted from the transponder TR to the base station BS, or if the transponder TR is to work within a certain definable frequency channel, as described above, then the modulation frequency $f_{mk}$ in the transponder should preferably be generated using a programmable frequency synthesizer, or should be derived from a basic clock using a programmable pulse divider. Control of the modulation frequency $f_{mk}$ will then preferably be undertaken by a microprocessor in the transponder TR.

To permit flexible setting of the mixture frequency $f_{mb}$ in the base station BS, and for selecting particular frequency channels via the bandpass filter BP2, it may also be logical to generate the mixture frequency $f_{mb}$ of the intermediate frequency mixer ZFMIX using a programmable frequency generator.

The transponder system presented can be used for diverse applications, and can of course be enhanced or modified using a wide variety of methods and components, which can be taken from the state-of-the-art technology in the field of transponders and positioning systems.

In particular, the principle presented can also be transferred across to the entire range of electromagnetic waves, for example from a few Hz up into the optical range, and also to other waveforms, for example sound.

With the applications cited above it is, as a general rule, very advantageous if the construction of high-frequency modules, and in particular the transponder TR, is as small and compact as possible. With access systems or payment systems, where the transponder TR is usually carried about the user's person, the convenience of carrying it is critically determined by the size of the transponder TR, for example in the form of a key or a payment/entry card.

High-frequency modules are usually built up on circuit boards made of organic materials, e.g. Teflon®- or epoxy-based. Particularly at lower HF frequencies, e.g. 1 GHz–10 GHz, it is only possible to satisfy the desire for small units to a very limited extent, because of the link between wavelengths and structural size. An alternative is circuits on thin-film ceramics, although their manufacture is very high-cost.

For this reason, the transponder TR and also the base station BS can be realized particularly advantageously as LTCC (Low-Temperature Cofired Ceramic) modules or by making use of LTCC modules. The high-frequency structures using LTCC as the basis are compact, on the one hand because of the comparatively large relative permittivity of LTCC but on the other hand also because they permit the circuit to be realized in multi-layer form. The manufacture of LTCC is cost-effective. Apart from this, LTCC modules can be fitted as components in a way compatible with mass production.

Because the HF circuit, or critical sub-components, can be completely integrated in an LTCC module, these integrated LTCC modules can be inserted as standard SMT (surface mount technology) components onto very cost-effective standard circuit boards which, for their part, must not necessarily be HF compatible. There is, of course, also the possibility of combining the technologies, and of building up LTCC submodules on circuit boards of organic materials, which can then however be significantly smaller.

An advantageous transponder TR using LTCC HF modules is shown in FIG. 8. Integrated on the LTCC module LM are, for example, a high-frequency oscillator HFO, a bandpass filter BP1 for filtering out interfering modulation components which arise from the switching (on/off) of the oscillator HFO at the rate provided by a timing generator TGEN, and a high-frequency pulse divider or counter CNT. A closed loop control circuit RK, which is fed with the clock pulses which have been divided down, or the counter value, as applicable, regulates the oscillator HFO to its target frequency as indicated, for example, in FIG. 7. With the exception of the connection for the antenna $ANT_T$, the only signals fed outwards from the LTCC module LM are digital signals of a comparatively low frequency, so that this module LM can be integrated cheaply and without problem into the rest of the circuit.

Figure 9:
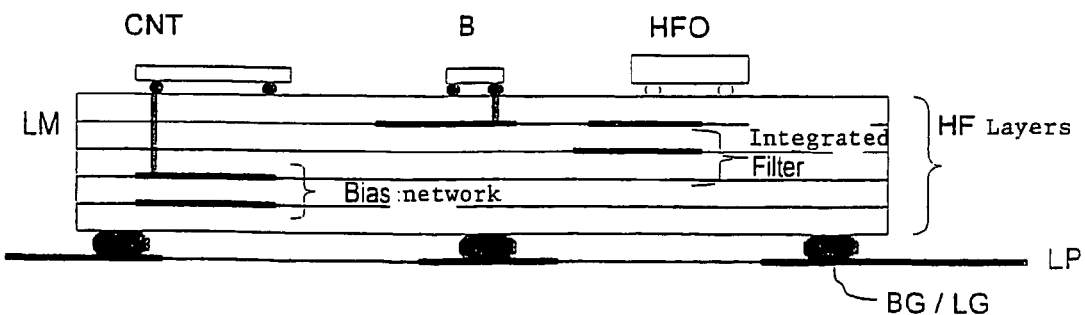
FIG. 9 a construction for such an LTCC module.

One possible construction of the LTCC module is shown schematically in FIG. 9. Here, the HF circuit consists of several layers or HF layers. Those components which cannot to be integrated into the inner layers, mainly for example semiconductors, are inserted into the upper side of the LTCC substrate. In the circuit in FIG. 8, these would be for example the oscillator HFO, the divider CNT and any other discrete components B. Insertion technologies which offer themselves are, in particular, SMT insertion or flip-chip insertion, which are known per se from [P. Heide: "Business Opportunities and Technology Trends—Millimeterwave Modules for Sensor Products and Broadband Wireless Communications", Compound Semiconductors Magazine, Vol. 6, No. 2, March 2000, pp. 82–88]. The LTCC module LM itself can be mounted on a standard circuit board LP using, for example, the so-called ball-grid or land-grid technique, BG/LG.

One fundamental consideration in the exemplary embodiments is that not only are the oscillations of the active oscillator in the transponder TR quasi-phase-coherent with the base signal, but even the excitation of the active oscillator is effected quasi-coherently. Whereas, with devices and methods in accordance with the state of the art, the excitation of the active oscillator is effected by thermal noise, and its oscillations are only later made quasi-phase-coherent by an expensive regulation process and lock-in, in the case of the object of this application the oscillator is even excited quasi-phase-coherently, by the base signal, or even starts to oscillate quasi-phase-coherently, as applicable, and hence phase-coherence is achieved automatically, as it were.

A basic idea is that in its idle state the oscillator will be in a delicate balance and, when it is switched on by an input of external energy, whatever its nature, must then first be excited into oscillation. Only after this initial impulse does the feedback, by which the oscillation is maintained, become active. Normally, for example, it is the thermal noise which is used for such an initialization of an oscillating circuit. That is to say, the oscillator starts oscillating with a random phase and amplitude, and then oscillates at the frequency dictated by its resonant circuit. However, if an external excitation signal is injected into the oscillator when it is switched on, and if the signal has a frequency in the bandwidth of the resonant circuit and a power considerably above the noise power, then the oscillator will start to oscillate not at random but synchronously with the phase of the exciting base signal. Depending on the frequency difference between the exciting base signal and the oscillator signal, and depending on the phase noise of the two oscillators, this quasi-phase-coherence will continue at least for some time.

The difference between the present concept and the known passive devices and methods consists in the use of an active oscillator. Thus, the base signal is not simply reflected back but, before being sent back, an oscillator signal which is almost noise-free is actively constructed using a separate quasi-phase-coherent source. The system thus has a significantly greater range than state-of-the art passive systems, although it has in other respects a similar function.

The oscillator signal from the active oscillator can serve as either a reply signal or a reference signal, depending on whether the signal transmission is unidirectional or bidirectional.

Furthermore, with the present device there is no need for closed loop control circuits for any carrier recovery required. There is a particular advantage in the case of transponder arrangements, in that no form of time, frequency or polarization multiplexing is necessary because the base and oscillator signals have no mutual effect on each other, or the only affect is a desired one at the start of the build-up transient, as applicable, and thereafter are quasi-phase-coherent, independently of each other.

It is advantageous if the device has a switching facility for switching the quasi-phase-coherent excitability of the active oscillator. This switching facility serves to put the active oscillator into a state from which it can, when excited by the base signal, start oscillating quasi-phase-coherently with the base signal.

Switching the excitability does not absolutely require that the oscillations are switched completely on and off. For example, if the active oscillator can oscillate in different modes, a second mode can simply be switched while oscillation of the first continues. Even if there is only one mode, the oscillation does not need to be completely switched off, but in general attenuating it, so that the base signal is enough to effect the next quasi-phase-coherent excitation, will suffice.

If the excitability of the active oscillator is switched on again after the coherence time, then the quasi-phase-coherence will be sustained over a longer period of time.

If, in a development, the quasi-phase-coherent excitability of the active oscillator is repeated cyclically, then the quasi-phase-coherence will also be sustained over longer periods of time. This can be achieved by designing the switching facility such that it switches the active oscillator at a prescribed clock rate.

Preferably, the length of the clock cycles for the clock rate will here correspond roughly to the coherence time. However, faster switching than this is also possible without the quasi-coherence between the base and oscillator signals being lost. If, on the other hand, the quasi-phase-coherence is only required within certain time windows, the clock time chosen can even be longer than the coherence time.

If the switching of the active oscillator is repeated cyclically, and if the active oscillator starts oscillating quasi-phase-coherently with the base signal on an cyclic basis, then the oscillator signal generated by the active oscillator can be regarded as a sampled copy of the base signal. If the sampling theorem applies, a signal is completely specified by its sample values. It is logical for the switch-off duration of the active oscillator not to be significantly longer than the switch-on duration, that is not significantly longer than the coherence time. In this case the sampling theorem applies intrinsically, because of the coherence condition. According to the sampling theorem, the phase difference between two sampling points must be less than 180°. This condition is less restrictive than the quasi-coherence condition. Consequently, from an information technology point of view the signal from the switched oscillator can, in spite of the switching process, be regarded as a copy of the reference signal, or as carrying its complete information, as applicable.

The excitability of the active oscillator can be switched relatively simply, by switching the oscillator itself. Correspondingly, the device can have a facility for switching the active oscillator on and off. Any facility which has the effect that the conditions for the oscillator to oscillate either apply or no longer apply is suitable for switching the oscillator. Thus, for example, the amplification in the oscillating circuit could be switched off, attenuation values or delay times (phases) changed, or the feedback circuit disconnected.

Apart from being excited in its fundamental mode, the oscillator can also be excited quasi-phase-coherently by its sub-harmonic modes of oscillation. To excite it therefore, either the fundamental mode or a subharmonic mode of oscillation of the base signal can be used.

If the device is used for identification, as an ID tag, or for communication, the coding can then, for example, be effected by the clock rate and/or an additional modulation unit, by which the quasi-phase-coherent signal is modulated before it is transmitted back.

As has already been explained, the coherence time is dependent on the frequency difference between the base and oscillator signals. The more precisely these frequencies agree, the longer will the phases of the signals be virtually identical. In order to increase the coherence time, by which means the clock rate of the switching facility can also be kept low, it can be advantageous to provide a suitable means for matching the oscillator frequency adaptively to the frequency of the base signal.

In choosing an active oscillator, it should be noted that its transient time should be small compared to the coherence time. So the quality of the oscillator should not be chosen to be excessive. However, the quality should also not be reduced too much, because oscillators with a low quality normally have high phase noise.

In the case of an arrangement with a device for generating an oscillator signal and with a base station in which the base signal is generated and from which it can be transmitted to the device, the oscillator signal can be sent back to the base station as a response signal to the base signal.

In an arrangement in which the device communicates with a base station via base and oscillator signals as the query and response signals, the base station will preferably have a bandpass filter, the central frequency of which corresponds roughly to the clock rate, and/or a means of eliminating the effect of the clock rate. Such means may be an additional mixer or a rectifier and a low-pass filter.

The invention claimed is:

1. Distance determination system for determining the distance from a base station (BS) to a transponder (TR), wherein
   the base station (BS) has an oscillating signal source ($OSZ_B$) for generating a signal ($s_{tx}(t)$) and a transmission device ($ANT_B$) for radiating out the signal ($s_{tx}(t)$),
   the transponder (TR) has a receiving device ($ANT_T$). for receiving the signal ($e_{rxt}(t)$) from the base station (BS), an oscillator ($OSZ_T$) for generating a signal ($s_{OSZ}(t)$) which is quasi-phase-coherent with the signal ($e_{rxt}(t)$) from the base station (BS), and a transmission device ($ANT_T$) for radiating out the quasi-phase-coherent signal ($s_{OSZ}(t)$), the oscillator ($OSZ_T$) excited with the received signal ($S_{rxt}(t)$) into generating a quasi-phase-coherent signal ($s_{OSZ}(t)$),
   the base station (BS) has in addition a receiving device ($ANT_B$) for receiving the quasi-phase-coherent signal ($s_{OSZ}(t)$) from the transponder (TR) and distance determination equipment (RMIX, FLT, DEMOD) for determining the distance (dist) between the base station (BS) and the transponder (TR), and
   the distance determination equipment (RXMIX, FLT, DEMOD) in the base station (BS) has a mixer (RX-MIX) for mixing the quasi-phase-coherent signal ($s_{rxt}(t)$) received from the transponder (TR) and the instantaneous transmit signal ($s_{tx}(t)$) to form a mixture signal ($S_{mix}(t)$).

2. Distance determination system in accordance with claim 1, wherein the distance determination equipment (RXMIX, FLT, DEMOD) is constructed to form the mixture signal ($S_{mix}(t)$) given by $$S_{mix}(t) = \cos(t \cdot \omega_{sw} + \tau \cdot (\omega_c + \omega_{sw}))$$

where $\omega_c$ is the central frequency of the base station oscillator ($OSZ_B$), $\omega_{SW}$ is the modulation frequency of the transmit signal $s_{tx}(t)$ from the base station (BS), t is the time in the interval 0-Ts, and $\tau$ is the time for the propagation of the signals over the distance (dist) between the base station (BS) and the transponder (TR).

3. Distance determination system in accordance with claim 1, wherein
   the distance determination equipment (RXMIX, FLT, DEMOD) has demodulation equipment (DEMOD, GR, TP), for reducing or eliminating changes in the voltage of the mixture signal ($S_{mix}(t)$), over the time interval (0–TS) between the measurement being switched on and switched off in the base station (BS), for the generation of a measurement signal ($S_{mess}(t)$).

4. Distance determination system in accordance with claim 1, wherein
   the distance determination equipment (RXMIX, FLT, DEMOD) has demodulation equipment (DEMOD, ZFMIX, LO, TP) for mixing down the mixture signal $s_{mix}(t)$, in particular with a frequency near to or the same as a clock frequency ($f_{mk}$), to a frequency significantly lower than the clock frequency ($f_{mk}$), for switching the oscillator ($OSZ_t$) in the transponder (TR) cyclically on and off, followed by the filtering out of high-frequency components to generate a measurement signal ($S_{mess}(t)$).

5. Distance determination system in accordance with claim 1, wherein the distance determination equipment (RXMIX, FLT, DEMOD) is constructed to modulate the modulation frequency ($\omega_{SW}$) of the transmit signal $s_{tx}(t)$ of the base station (BS), in particular such that $$\omega_{sw} = \frac{2 \cdot \pi \cdot B \cdot t}{T}$$

where T is a length of time over which the frequency is modulated across the bandwidth B.

6. Distance determination system in accordance with claim 1, wherein the distance determination equipment (RXMIX, FLT, DEMOD) is constructed to form a resulting FMCW signal ($s_{messfmcw}(t)$) as $$s_{mess_{fmcw}}(t) = \cos\left(\omega_c \cdot \tau + \frac{2 \cdot \pi \cdot B \cdot t \cdot \tau}{T} + \frac{\pi \cdot B \cdot t \cdot T_s}{T}\right) \cdot \frac{\sin\left(\frac{\pi \cdot B \cdot t \cdot T_s}{T}\right)}{\left(\frac{\pi \cdot B \cdot t}{T}\right)}.$$

7. Distance determination system in accordance with claim 6, wherein the distance determination equipment (RXMIX, FLT, DEMOD) performs a Fourier transformation of the amplitude-weighted measurement signal ($s_{messfmcw}(t)$) in the frequency domain, so that edges of a left and a right sideband of at least one squarewave function which results determine the distance between the base station (BS) and the transponder (TR).

8. Distance determination system in accordance with claim 1, wherein the distance determination equipment (RXMIX, FLT, DEMOD) is constructed for determining the distance (dist) from the measuring frequency ($f_{mess}$) which corresponds to a normal FMCW measurement frequency (Frequency Modulated Continuous Wave) displaced by a frequency component ($\Delta b = B*Ts/(2\,T)$).

9. Distance determination system for determining the distance (dist) between a base station (BS) and a transponder (TR), wherein the base station (BS) has an oscillating signal source ($OSZ_B$) for generating a signal ($s_{tx}$) and a transmission device ($ANT_B$) for radiating out the signal ($s_{tx}(t)$), the transponder (TR) has a receiving device ($ANT_T$) for receiving the signal ($e_{rxt}(t)$) from the base station (BS), an oscillator ($OSZ_t$) for generating a signal ($s_{OSZ}(t)$) which is quasi-phase-coherent with the signal ($e_{rxt}(t)$) from the base station (BS), and a transmission device ($ANT_T$) for radiating out the quasi-phase-coherent signal ($s_{OSZ}(t)$), the base station (BS) has in addition a receiving device ($ANT_B$) for receiving the quasi-phase-coherent signal ($s_{OSZ}(t)$) from the transponder (TR) and distance determination equipment (RMTX, FLT, DEMOD) for determining the distance (dist) between the base station (BS) and the transponder (TR), the oscillator ($OSZ_T$) in the transponder (TR) is excited with the received signal ($s_{rxt}(t)$) into generating a quasi-phase-coherent signal ($s_{OSZ}(t)$), and the transponder (TR) or the base station (BS), is constructed as an LTCC (Low Temperature Cofired Ceramic) module (LM), or making use of at least one LTCC module (LM).

10. Distance determination system for determining the distance (dist) between a base station (BS) and a transponder (TR), wherein the base station (BS) has an oscillating signal source ($OSZ_B$) for generating a signal ($s_{tx}(t)$) and a transmission device ($ANT_B$) for radiating out the signal ($s_{tx}(t)$), the transponder (TR) has a receiving device ($ANT_T$) for receiving the signal ($e_{rxt}(t)$) from the base station (BS), an oscillator ($OSZ_T$) for generating a signal ($s_{OSZ}(t)$) which is quasi-phase-coherent with the signal ($e_{rxt}(t)$) from the base station (BS), and a transmission device ($ANT_T$) for radiating out the quasi-phase-coherent signal ($s_{OSZ}(t)$), the base station (BS) has in addition a receiving device ($ANT_B$) for receiving the quasi-phase-coherent signal ($s_{OSZ}(t)$) from the transponder (TR) and distance determination equipment (RMIX, FLT, DEMOD) for determining the distance (dist) between the base station (BS) and the transponder (TR), the oscillator ($OSZ_T$) in the transponder (TR) is excited with the received signal ($s_{rxt}(t)$) into generating a quasi-phase-coherent signal ($s_{OSZ}(t)$), and the transponder is equipped with signal generation equipment ($OSZ_T$, CLK/Sw) for generating an oscillator signal ($s_{OSZ}(t)$) from a signal received by the transponder ($e_{rxt}(t) = s_{tx}(t-\tau/2)$) using an oscillator ($OSZ_T$) and a switching facility (CLK/Sw) for switching the oscillator ($OSZ_T$) cyclically on and off, for generating an oscillator signal defined by $$s_{rx}(t) = s_{osz}\left(t - \frac{\tau}{2}\right) = \sin(\omega_{osz} \cdot t - (\omega_c + \omega_{sw}) \cdot \tau + \phi_o)$$

where $\omega_c$ is the central frequency of the base station oscillator ($OSZ_B$), $\omega_{SW}$ is the modulation frequency of the transmit signal $s_{tx}(t)$ from the base station (BS), t is the time in the interval 0–Ts, and $\tau$ is the time for the propagation of the signals over the distance (dist) between the base station (BS) and the transponder (TR) and $\phi_0$ is an arbitrary phase offset.

11. Distance determination system for determining the distance (dist) between a base station (BS) and a transponder (TR), wherein the base station (BS) has an oscillating signal source ($OSZ_B$) for generating a signal ($s_{tx}(t)$) and a transmission device ($ANT_B$) for radiating out the signal ($s_{tx}(t)$), the transponder (TR) has a receiving device ($ANT_T$) for receiving the signal ($e_{rxt}(t)$) from the base station (BS), an oscillator ($OSZ_T$) for generating a signal ($s_{OSZ}(t)$) which is quasi-phase-coherent with the signal ($e_{rxt}(t)$) from the base station (BS), and a transmission device ($ANT_T$) for radiating out the quasi-phase-coherent signal ($s_{OSZ}(t)$), the base station (BS) has in addition a receiving device ($ANT_B$) for receiving the quasi-phase-coherent signal ($s_{OSZ}(t)$) from the transponder (TR) and distance determination equipment (RMIX, FLT, DEMOD) for determining the distance (dist) between the base station (BS) and the transponder (TR), the oscillator ($OSZ_T$) in the transponder (TR) is excited with the received signal ($s_{rxt}(t)$) into generating a quasi-phase-coherent signal ($s_{OSZ}(t)$), and the transponder further comprises a modulator providing a modulation ($f_{mk}$) used for switching the oscillator ($OSZ_T$) in the transponder (TR) on and off, for transmitting additional information from the transponder (TR) to the base station (BS).

12. Distance determination system for determining the distance (dist) between a base station (BS) and each of plural transponders (TR), wherein the base station (BS) has an oscillating signal source ($OSZ_B$) for generating a signal ($s_{tx}(t)$) and a transmission device ($ANT_B$) for radiating out the signal ($s_{tx}(t)$), each transponder (TR) has a receiving device ($ANT_T$) for receiving the signal ($e_{rxt}(t)$) from the base station (BS), an oscillator ($OSZ_t$) for generating a signal ($s_{OSZ}(t)$) which is quasi-phase-coherent with the signal ($e_{rxt}(t)$) from the base station (BS), and a transmission device ($ANT_T$) for radiating out the quasi-phase-coherent signal ($s_{OSZ}(t)$), the base station (BS) has in addition a receiving device ($ANT_B$) for receiving the quasi-phase-coherent signal ($s_{OSZ}(t)$) from the transponder (TR) and distance determination equipment (RMIX, FLT, DEMOD) for determining the distance (dist) between the base station (BS) and the transponder (TR), and the oscillator ($OSZ_T$) in the transponder (TR) is excited with the received signal ($s_{rxt}(t)$) into generating a quasi-phase-coherent signal ($s_{OSZ}(t)$), and each transponder is provided with a modulator having an individual modulation ($f_{mk}$) for switching the oscillator ($OSZ_T$) in the transponder (TR) on and off so that each transponder has a unique individual modulation different from the other individual modulations of the other transponders.

* * * * *